(12) United States Patent
Kawaguchi et al.

(10) Patent No.: US 7,625,640 B2
(45) Date of Patent: Dec. 1, 2009

(54) ELECTROMAGNETIC NOISE SUPPRESSOR, STRUCTURE WITH ELECTROMAGNETIC NOISE SUPPRESSING FUNCTION, AND METHOD OF MANUFACTURING THE SAME

(75) Inventors: Toshiyuki Kawaguchi, Tokyo (JP); Atsushi Taniguchi, Tokyo (JP); Takashi Gonda, Tokyo (JP)

(73) Assignee: Shin-Etsu Polymer Co., Ltd. (JP)

( * ) Notice: Subject to any disclaimer, the term of this patent is extended or adjusted under 35 U.S.C. 154(b) by 99 days.

(21) Appl. No.: 10/538,132

(22) PCT Filed: Feb. 24, 2004

(86) PCT No.: PCT/JP2004/002104

§ 371 (c)(1),
(2), (4) Date: Jun. 9, 2005

(87) PCT Pub. No.: WO2005/081609

PCT Pub. Date: Sep. 1, 2005

(65) Prior Publication Data

US 2006/0038630 A1 Feb. 23, 2006

(51) Int. Cl.
*B32B 15/00* (2006.01)
(52) U.S. Cl. .................................................. 428/692.1
(58) Field of Classification Search ................. 428/692, 428/447, 411.1, 448, 450
See application file for complete search history.

(56) References Cited

U.S. PATENT DOCUMENTS

| | | | |
|---|---|---|---|
| 4,784,739 A | 11/1988 | Kadokura et al. | ........ 204/192.2 |
| 5,827,445 A | 10/1998 | Yoshida et al. | ........... 252/62.54 |

(Continued)

FOREIGN PATENT DOCUMENTS

JP  05-183285  7/1993

(Continued)

OTHER PUBLICATIONS

Tsuyoshi Ideguchi, et al., "Reduction Characteristics of Common Mode Effective Power on Metallic Lines When Putting a Thin Metal Plate Close To Them", pp. 1386-1390, No. 7, vol. J84-B, (Jul. 2001) Journal of The Institute of Electronics Information and Communication Engineers of Japan. English translation attached.

(Continued)

*Primary Examiner*—Kevin M. Bernatz
*Assistant Examiner*—Gary D. Harris
(74) *Attorney, Agent, or Firm*—Ostrolenk Faber LLP

(57) ABSTRACT

An electromagnetic noise suppressor of the present invention has magnetic resonance frequency of 8 GHz or higher, and the imaginary part $\mu''_H$ of complex magnetic permeability at 8 GHz is higher than the imaginary part $\mu''_L$ of complex magnetic permeability at 5 GHz. Such an electromagnetic noise suppressor is capable of achieving sufficient electromagnetic noise suppressing effect over the entire sub-microwave band. The electromagnetic noise suppressor can be manufactured by forming a composite layer 3 on the surface of a binding agent 2 through physical deposition of a magnetic material on the binding agent 2. The structure with an electromagnetic noise suppressing function of the present invention is a printed wiring board, a semiconductor integrated circuit or the like that is covered with the electromagnetic noise suppressor on at least a part of the surface of the structure.

7 Claims, 4 Drawing Sheets

U.S. PATENT DOCUMENTS

| | | | |
|---|---|---|---|
| 5,864,088 A | 1/1999 | Sato et al. | 174/386 |
| 5,990,417 A * | 11/1999 | Senda et al. | 174/391 |
| 6,104,530 A | 8/2000 | Okamura et al. | 359/359 |
| 6,448,491 B1 | 9/2002 | Sato et al. | 174/35 |
| 6,869,683 B2 * | 3/2005 | Sakurai et al. | 428/448 |
| 6,921,573 B2 * | 7/2005 | Watanabe et al. | 428/343 |
| 7,160,636 B2 * | 1/2007 | Kondo et al. | 428/836.1 |
| 2004/0157085 A1 * | 8/2004 | Kondo et al. | 428/692 |
| 2004/0219328 A1 | 11/2004 | Tasaki et al. | 428/65.3 |
| 2006/0038630 A1 * | 2/2006 | Kawaguchi et al. | 333/12 |
| 2006/0083948 A1 * | 4/2006 | Kawaguchi et al. | 428/692.1 |
| 2007/0077369 A1 * | 4/2007 | Kondo et al. | 427/547 |

FOREIGN PATENT DOCUMENTS

| | | |
|---|---|---|
| JP | 7-212079 | 8/1995 |
| JP | 09-035927 | 2/1997 |
| JP | 9-74297 | 3/1997 |
| JP | 9-93034 | 4/1997 |
| JP | 09-115708 | 5/1997 |
| JP | 9-130077 | 5/1997 |
| JP | 9-181476 | 7/1997 |
| JP | 10-229292 | 8/1998 |
| JP | 10-308596 | 11/1998 |
| JP | 11-354972 | 12/1999 |
| JP | 2000-196281 | 7/2000 |
| JP | 2000-307287 | 11/2000 |
| JP | 2000-348916 | 12/2000 |
| JP | 2001-53485 | 2/2001 |
| JP | 2001-053487 | 2/2001 |
| JP | 2001-308583 | 11/2001 |
| JP | 2001308574 | 11/2001 |
| JP | 2002-084091 | 3/2002 |
| JP | 2002-118008 | 4/2002 |
| JP | 2003-078276 | 3/2003 |
| JP | 2003-115692 | 4/2003 |
| JP | 2003-324299 | 11/2003 |
| JP | 2003-343627 | 12/2003 |
| JP | 2003-343631 | 12/2003 |
| WO | WO 03/021610 | 3/2003 |

OTHER PUBLICATIONS

Office Action mailed Oct. 23, 2007 in related U.S. Appl. No. 10/540,825.

Masaki ABE et al., "Application of Thin Ferrite Film and Ultra-Fine Particles formed in Aqueous Solution to Microwave/Nano-Biotechnology", p. 721-729, No. 6, vol. 27, 2003; Journal of The Magnetics Society of Japan.

International Search Report PCT/JP2004/002104 filed Apr. 27, 2004.

Office Action issued on Oct. 21, 2008 in counterpart Japanese Patent Application No. 2004-018465, with English translation thereof.

Japanese Office Action dated Mar. 11, 2008 in Application No. 2003-343627.

Japanese Office Action dated Mar. 11, 2008 in Application No. 2003-343631.

Engineering Plastics Application Handbook, Dec. 15, 1982, First Edition, First Printing (with translation).

Farris et al., "The Characterization of Thermal and Elastic Constants for an Epoxy Photoresist SU8 Coating," Journal of Materials Science 37 (2002), pp. 4793-4799.

Japanese Office Action (for Japanese Patent Appl. No. 2004-059115) dated May 12, 2009 (with English translation).

Japanese Office Action (for Japanase Patent Appl. No. 2004-018466) dated May 12, 2009 (with English translation).

Japanese Office Action (for Japanese Patent Appl. No. 2003-338422) dated May 12, 2009 (with English translation).

Shigehiro Ohnuma et al., "Noise suppression effect by nano-granular magnetic films at Ghz frequency", *Proceedings of the* 131st *Conference*, pp. 17-24, Jul. 4, 2003; The Magnetics Society of Japan (Eng. Abstract included).

Masaki Abe et al., "Low temperature fabrication of ferrite films and their noise spression characteristics", Proceeding of the 131s' Conference, pp. 25-31, Jul. 4, 2003; The Magnetics Society of Japan (Eng. Abstract included).

Ki Hyeon Kim et al. "Applications of Spin Sprayed Ferrite Films on Coplanar Transmission Line for RF Noise Supression", *Trans. Magn. Soc. Japan*, 3(4):133-136 (2003).

International Search Report for PCT/JP2004/003951 dated Jul. 6, 2004.

\* cited by examiner

ELECTROMAGNETIC NOISE SUPPRESSOR, STRUCTURE WITH ELECTROMAGNETIC NOISE SUPPRESSING FUNCTION, AND METHOD OF MANUFACTURING THE SAME

CROSS REFERENCE TO RELATED APPLICATION

The present application is a 35 U.S.C. §371 national phase conversion of PCT/JP2004/002104 filed 24 Feb. 2004.

TECHNICAL FIELD

The present invention relates to an electromagnetic noise suppressor that suppresses electromagnetic noise, to a structure with an electromagnetic noise suppressing function, and to a method of manufacturing the same.

BACKGROUND ART

In recent years, as the use of the Internet has increased, electronic apparatuses that use CPUs running at high clock frequencies in a sub-microwave band (0.3 to 10 GHz), electronic apparatuses that use high frequency bus, and telecommunication apparatuses that utilize radio waves have been increasing, such as personal computers, home appliances having information processing functions, wireless LAN, bluetooth-equipped apparatuses, optical module, mobile telephones, mobile information terminals and intelligent road traffic information system. This trend leads to a society of ubiquitous computing that requires devices of higher performance with high-speed digital information processing function and low-voltage driving. However, as such apparatuses become popular, concerns have been increasing on the problems related to the electromagnetic interference such as malfunctioning of an apparatus that emits electromagnetic radiation or other apparatuses and health threats to humans. For this reason, such an apparatus is required to minimize the emission of unnecessary electromagnetic radiation so as not to affect its own operation and that of other apparatuses and so as not to cause adverse effects on the human body, and to operate without malfunctioning when subjected to electromagnetic radiation emitted by other apparatuses. Measures to prevent such electromagnetic interference include the use of an electromagnetic radiation shielding material that reflects electromagnetic radiation and the use of an electromagnetic radiation absorbing material.

As a means for preventing electromagnetic interference between electronic apparatuses, electromagnetic radiation shielding material is provided on the surface of the housing of the electronic apparatus or between the electronic apparatuses so as to block electromagnetic radiation (inter-system EMC). As a means for preventing electromagnetic interference within an electronic apparatus, electronic components and circuits are covered with electromagnetic radiation shielding material so as to prevent the electronic components and circuits from interfering with each other and resulting in malfunction, and suppressing the processing speed from decreasing and signal waveform from being distorted (intra-system EMC). Particularly in near-field environments such as within an electronic apparatus, it has been required to suppress the generation of electromagnetic noise by providing electromagnetic noise suppressing measures to electronic components that are the sources of the electromagnetic noise or to suppress the interference between signals thereby to improve the transmission characteristic (micro EMC).

Electronic apparatuses and electronic components are recently required to have higher performance and become smaller and lighter in weight, and the electromagnetic noise suppressor used in these apparatuses or components is also required to have high electromagnetic noise suppressing effects in a high-frequency band such as a sub-microwave band, be smaller and lighter in weight, and be easy to carry out by the work which takes measures with electromagnetic noise suppressing measures.

As the electromagnetic radiation shielding material, for example, an electromagnetic noise suppressor including a mixture of two kinds of soft magnetic material powder having different mean particle sizes, namely soft magnetic material powder particles having morphological magnetic anisotropy, that are dispersed in an organic binding agent is disclosed in Japanese Patent Application, First Publication No. Hei 9-35927.

In the publication described above, the electromagnetic noise suppressor is disclosed to have anisotropic magnetic fields of different intensities so as to demonstrate a plurality of magnetic resonances and different values of the imaginary part of complex magnetic permeability ($\mu''$) that correspond to different frequencies are superposed, thus resulting in the distribution of the imaginary part of complex magnetic permeability ($\mu''$) over a wide range of frequencies. The imaginary part of complex magnetic permeability ($\mu''$) is a magnetic loss term required for absorbing electromagnetic radiation, and it is said that high electromagnetic noise suppressing effect can be achieved as the imaginary part of complex magnetic permeability ($\mu''$) is distributed over a wide range of frequencies.

As another electromagnetic radiation shielding material, an electromagnetic radiation absorbing material having a composite structure of flake-shaped powder of iron nitride ($Fe_{16}N_2$) and a resin is disclosed in Japanese Unexamined Patent Application, First Publication No. 2001-53487.

In the publication described above, it is described that, when the magnetic material has a high value of saturation magnetization Is, value of fr($\mu'-1$) that represents the limit of magnetic permeability increases, thus limitation line shifts toward higher frequency, so that higher magnetic permeability is achieved at high frequencies. As a result, it is claimed, that the use of iron nitride that has the highest saturation magnetization among various magnetic materials enables it to achieve higher magnetic permeability at higher frequencies with the resonance frequency fr reaching about 5 GHz. It is also described that the resonance frequency can be freely varied in a range from several hundreds of MHz to near 10 GHz by controlling the composition of the resin, heat treatment conditions, shape of the iron nitride particles and/or aspect ratio. An example of application is shown where ICs mounted on a wiring board are covered, together with the leads thereof, with an electromagnetic absorbing material in the state of a paste.

As another electromagnetic radiation shielding material, a NiZn ferrite thin film is known that can be used to suppress electromagnetic interference (EMI) in the sub-microwave band (Masaki ABE et al., "Application of Thin Ferrite Film and Ultra-Fine Particles formed in Aqueous Solution to Microwave/Nano-Biotechnology", pp 721-729, No. 6, Vol. 27, 2003; Journal of The Magnetics Society of Japan).

This publication describes a NiZn ferrite thin film having the resonance frequency increased to 1.2 GHz. It is also described that the NiZn ferrite thin film is formed by plating on the surface of lead wires or semiconductor devices of a circuit by spin spraying process, and the NiZn ferrite thin film absorbs noise current before electromagnetic noise is generated from the noise current.

However, the electromagnetic interference suppressor (Japanese Unexamined Patent Application, First Publication No. Hei 9-35927) that is claimed to have imaginary part of complex magnetic permeability ($\mu''$) distributed over a broad range of frequencies is made by simply increasing the imaginary part of complex magnetic permeability ($\mu''$) partially, as indicated by the $\mu$-f characteristic diagrams of FIG. 2 and FIG. 3 of this publication, and has magnetic resonance frequency lower than 2 GHz. Also the values of the imaginary part of complex magnetic permeability ($\mu''$) shown in the $\mu$-f characteristic diagrams are only those for frequencies up to 2 GHz, thus it is impossible to prove sufficient electromagnetic noise suppressing effect over the entire sub-microwave band.

With regards to the electromagnetic radiation absorbing material having composite structure of flake-shaped powder of iron nitride and a resin disclosed in Japanese Unexamined Patent Application, First Publication No. 2001-53487, it is described that flake-shaped powder of iron nitride ($Fe_{16}N_2$) in quasi stable structure is made by thin film forming process such as vacuum vapor deposition, sputtering, CVD, MBE or the like, although details are not known since no examples are described. However, it is difficult to stabilize the crystal structure of iron nitride ($Fe_{16}N_2$), and iron nitride of stable structure is also included. Thus it is difficult to make flake-shaped powder of iron nitride ($Fe_{16}N_2$) that has sufficiently high saturation magnetization. It is also very difficult and impractical to make flake-shaped or disk-shaped fine powder of iron nitride ($Fe_{16}N_2$) by using a mask. It is described that the resonance frequency can be varied up to near 10 GHz by controlling the composition of the resin, heat treatment conditions, shape of the $Fe_{16}N_2$ particles and/or aspect ratio. However, examples are given only for those having resonance frequencies up to about 5 GHz (FIG. 5 of Japanese Unexamined Patent Application, First Publication No. 2001-53487), and there remain problems in practical application.

Although resonance frequency of the NiZn ferrite thin film proposed by ABE et al. is made higher, it is below 2 GHz and is not sufficient for an electromagnetic noise suppressor used in sub-microwave band. Also, this publication gives the values of the imaginary part of complex magnetic permeability ($\mu''$) only for frequencies up to 3 GHz in the complex magnetic permeability spectrum (FIG. 4), while the spectrum is about to decrease at 3 GHz, indicating that the resonance frequency cannot increase further. The publication also shows the manufacture of a NiZn ferrite thin film by directly plating onto copper wires and semiconductor devices of a circuit, as an example of application. Since the plating solution contains cations of Na, etc. and anions such as chlorine and nitrous acid, it requires careful cleaning when used for semiconductor devices, resulting in increased number of operation processes.

When soft magnetic material powder or flake-shaped powder of iron nitride is used, it must be used in a large amount in order to achieve sufficient electromagnetic interference suppressing effect and electromagnetic radiation absorbing effect, the amount being usually about 90% by weight of the electromagnetic interference suppressor and electromagnetic radiation absorbing material. When soft magnetic material powder or flake-shaped powder of iron nitride is used, it is also necessary to increase the thickness of the electromagnetic interference suppressor or the electromagnetic radiation absorbing material in order to achieve sufficient electromagnetic interference suppressing effect and electromagnetic radiation absorbing effect. Thus, there has been a problem in that the electromagnetic interference suppressor or the electromagnetic radiation absorbing material has high specific gravity and is thick, and is therefore heavy.

There has also been a problem in that the electromagnetic interference suppressor or the electromagnetic radiation absorbing material is thick and makes it difficult to reduce the space requirement.

The electromagnetic interference suppressor or the electromagnetic radiation absorbing material also lacks flexibility and is brittle, since it is constituted mostly from the soft magnetic material powder or the flake-shaped powder of iron nitride, with a small content of binding agent.

With the background described above, an object of the present invention is to provide an electromagnetic noise suppressor that has sufficient electromagnetic noise suppressing effect over the entire sub-microwave band, a structure such as printed wiring board or semiconductor integrated circuit that is provided with electromagnetic noise suppressing means and a method for easily manufacturing the same.

Another object of the present invention is to provide an electromagnetic noise suppressor that requires smaller installation space and is lighter in weight, flexible, and has high strength.

DISCLOSURE OF INVENTION

The present inventors considered that the way to achieve high electromagnetic noise suppressing effect in the sub-microwave band is to transform noise current into thermal energy by means of the magnetic loss characteristic of a magnetic material, which means that the material has sufficiently high value of the imaginary part of complex magnetic permeability ($\mu''$) (namely loss term) in this frequency band. After studying the integration of the binding agent and the magnetic material dispersed in the former in the atomic state so as to make use of the effect of magnetic anisotropy such as morphological anisotropy, the inventors developed an electromagnetic noise suppressor of high magnetic resonance frequency that can be used in the sub-microwave band.

The electromagnetic noise suppressor of the present invention is characterized in that the magnetic resonance frequency is 8 GHz or higher, and the imaginary part of complex magnetic permeability ($\mu''_H$) at 8 GHz is higher than the imaginary part of complex magnetic permeability ($\mu''_L$) at 5 GHz. Such an electromagnetic noise suppressor can demonstrate sufficient electromagnetic noise suppressing effect over the entire sub-microwave band.

The electromagnetic noise suppressor of the present invention preferably has a composite layer formed by integrating the binding agent and the magnetic material. Such an electromagnetic noise suppressor can have magnetic resonance frequency of 8 GHz or higher, and make the imaginary part of complex magnetic permeability $\mu''_H$ at 8 GHz higher than the imaginary part of complex magnetic permeability $\mu''_L$ at 5 GHz, and enables it to reduce the space requirement and weight. In the case in which the composite layer is a layer formed by physically vapor-depositing the magnetic material onto the binding agent, the composite layer has such a constitution as the magnetic material is dispersed in the binding agent so that the magnetic material and the binding agent are integrated with each other so as to provide high electromagnetic noise suppressing effect. The composite layer does not contain impurity ions so that there is no possibility of damage to the electronic circuit by the impurity ions.

In the case in which the binding agent is a resin or rubber, the electromagnetic noise suppressor can be made flexible and have high strength.

If the binding agent is a hardening resin, the magnetic material can be dispersed more uniformly in the binding agent that has not yet cured. After the binding agent has cured, the magnetic material does not crystallize into fine particles, and such a composite layer can be obtained as the binding agent and the magnetic material are integrated at the atomic level.

A method of manufacturing an electromagnetic noise suppressor of the present invention includes a vapor deposition process of physically vapor-depositing a magnetic material onto a binding agent to form a composite layer on the surface of the binding agent. Such a manufacturing method enables it to easily manufacture the electromagnetic noise suppressor of the present invention that has the composite layer constituted from the binding agent and the magnetic material integrated together.

A structure with an electromagnetic noise suppressing function of the present invention is a structure with at least a part of the surface thereof covered by the electromagnetic noise suppressor of the present invention. The structure with an electromagnetic noise suppressing function enables it to dispose the electromagnetic noise suppressor in a small space near a noise source and efficiently suppress electromagnetic noise in a sub-microwave band.

A method of manufacturing a structure with an electromagnetic noise suppressing function of the present invention includes a coating process of coating at least a part of the surface of the structure with a binding agent, and a vapor deposition process of physically vapor-depositing a magnetic material onto the binding agent to form a composite layer on the surface of the binding agent. Such a manufacturing method enables it to easily manufacture the structure with an electromagnetic noise suppressing function that can efficiently suppress electromagnetic noise in a sub-microwave band.

BEST MODE FOR CARRYING OUT THE INVENTION

The present invention will now be described in detail.

<Electromagnetic Noise Suppressor>

The electromagnetic noise suppressor of the present invention has magnetic resonance frequency of 8 GHz or higher, and the imaginary part of complex magnetic permeability ($\mu''_H$) at 8 GHz being higher than the imaginary part of complex magnetic permeability ($\mu''_L$) at 5 GHz.

Complex magnetic permeability is expressed as $\mu = \mu' - j\mu''$. $\mu'$ is the real part of the complex magnetic permeability and $\mu''$ is the imaginary part of the complex magnetic permeability, that represents the magnetic loss related to the absorption of electromagnetic radiation.

The magnetic resonance frequency is a frequency at which the value of the real part $\mu'$ of the complex magnetic permeability becomes one-half of the peak value, and the frequency is higher than the peak frequency. The magnetic resonance frequency is regarded as the upper limit of frequencies at which noise current can be transformed into thermal energy by means of the magnetic loss characteristic of the magnetic material.

In order for the electromagnetic noise suppressor of the present invention to fully demonstrate the electromagnetic noise suppressing effect over the sub-microwave band, it is necessary that the magnetic resonance frequency be 8 GHz or higher, and that the imaginary part $\mu''_H$ of complex magnetic permeability at 8 GHz be higher than the imaginary part $\mu''_L$ of complex magnetic permeability at 5 GHz, that is, the imaginary part $\mu''$ of complex magnetic permeability increases monotonically with the frequency. The magnetic resonance frequency of the electromagnetic noise suppressor of the present invention is preferably 10 GHz or higher.

The magnetic resonance frequency of the electromagnetic noise suppressor of the present invention having a magnetic resonance frequency of 8 GHz or higher, and the imaginary part $\mu''_H$ of complex magnetic permeability at 8 GHz being higher than the imaginary part $\mu''_L$ of complex magnetic permeability at 5 GHz can be made by forming the composite layer consisting of the magnetic material and part of the binding agent being integrated with each other at the nanometer scale.

The composite layer is a layer formed by physical vapor deposition of the magnetic material on the binding agent, where the magnetic material applied by physical vapor deposition is dispersed in the binding agent and integrated therewith in the atomic state, without forming a homogeneous film.

Figure 1:
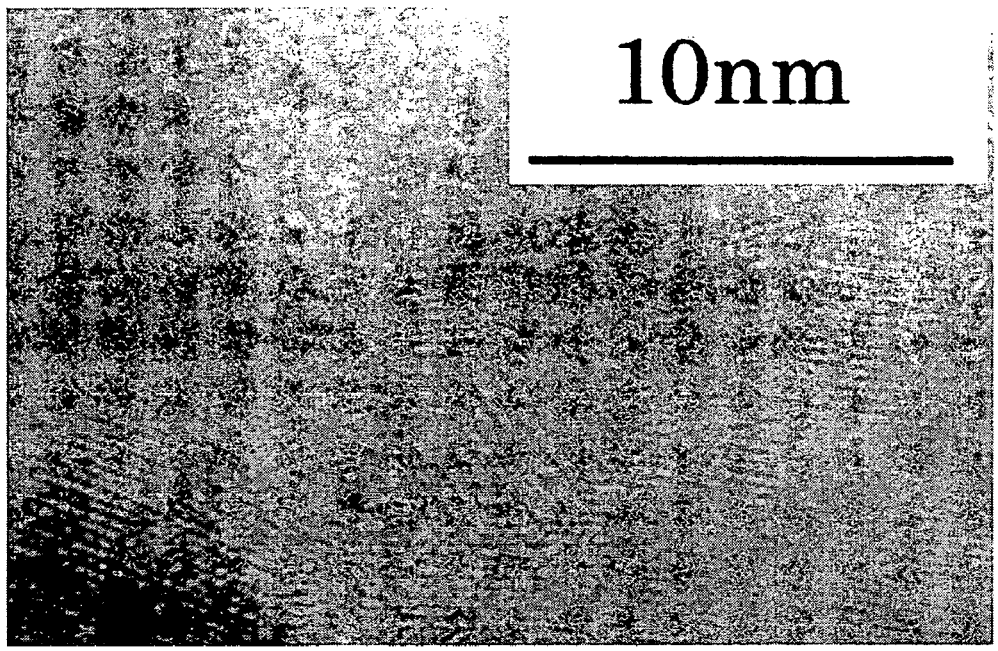
FIG. 1 shows an image of a composite layer of an electromagnetic noise suppressor of the present invention observed with a high-resolution transmission electron microscope.
Figure 2:
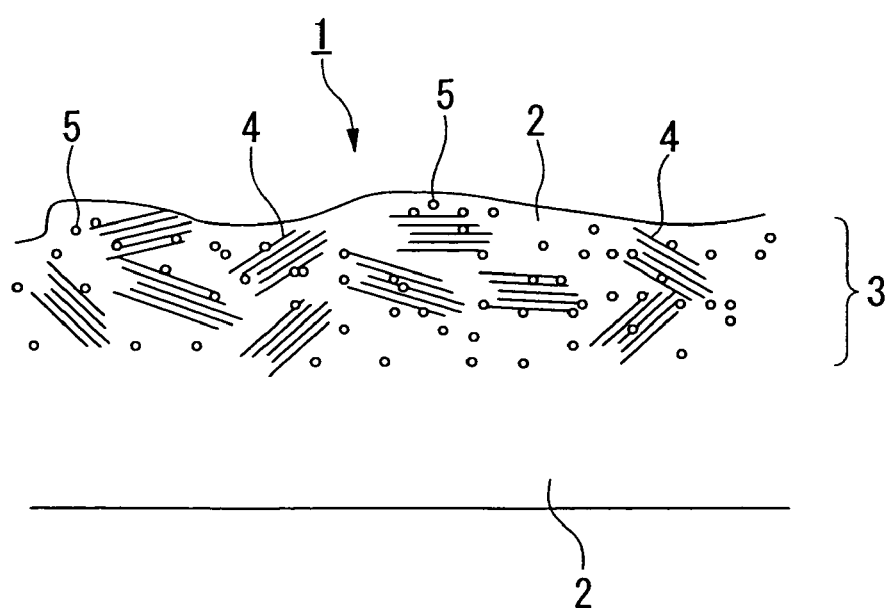
FIG. 2 is a schematic diagram showing the vicinity of the composite layer in an example.

More specifically, as shown in the high-resolution transmission electron microscope image of FIG. 1 and the sketch of FIG. 2 which simplifies the electron microscope image, the electromagnetic noise suppressor 1 is constituted only from the composite layer 3 consisting of atoms of the magnetic material mixed with molecules of the binding agent 2, and a layer consisting only of the binding agent 2.

The composite layer 3 consists of a portion where crystal lattice 4 is observed to be made up of atoms of the magnetic material disposed at spacing of several angstroms forming a very small crystal, a portion where only the binding agent 2 is observed without presence of the magnetic material in a very small region, and a portion where atoms of the magnetic material 5 are observed to be dispersed in the binding agent without crystallizing. In other words, the magnetic material does not form fine particles having crystalline structure with clear grain boundary, but forms a complicated heterogeneous structure (a structure that is not homogeneous nor uniform) where the binding agent and the magnetic material are integrated at the nanometer scale.

The thickness of the composite layer is the depth of infiltration of the atoms of the magnetic material into the surface layer of the binding agent, that is dependent on such factors as the weight of the magnetic material deposited, kind of the binding agent and the conditions of physical vapor deposition, and is roughly in a range from 1.5 to 3 times the thickness of the magnetic material layer formed by the vapor deposition. When the thickness of the composite layer is set to be not less than 0.005 µm, atoms of the magnetic material and the binding agent can be integrated in a dispersed state, giving rise to a high loss characteristic in high frequency region due to the morphological anisotropy, thus achieving sufficient electromagnetic noise suppressing effect. When the thickness of the composite layer exceeds 3 µm, on the other hand, a clear crystalline structure and then a homogeneous film of the magnetic material is formed to form a bulk magnetic material. This leads to a decrease in morphological anisotropy and less electromagnetic noise suppressing effect. Therefore, thickness of the composite layer is preferably 1 µm or less, more preferably 0.3 µm or less.

Examples of the binding agent include, but are not limited to, organic materials, for example, resins such as polyolefine resin, polyamide resin, polyester resin, polyether resin, polyketone resin, polyimide resin, polyurethane resin, polysiloxane resin, phenol resin, epoxy resin, acrylic resin and polyacrylate resin; diene rubbers such as natural rubber, isoprene rubber, butadiene rubber and styrene butadiene rubber; non-diene rubbers such as butyl rubber, ethylene propylene rubber, urethane rubber and silicone rubber. The binding agent may also be of thermoplastic or thermosetting nature, or a material that has not yet been cured. The resin or rubber described above that is modified, mixed or copolymerized may also be used.

The binding agent may also be an inorganic material that has a low elastic modulus in shear that will be described later, such as an aero gel or foamed silica that has high void ratio and such a level of hardness that can capture ultra-fine particles. It may also be used in the form of a composite material with the organic material described above.

The binding agent preferably has a low elastic modulus in shear in view of the ease of atoms of the magnetic material to infiltrate into the binding agent during the physical vapor deposition of the magnetic material. The elastic modulus in shear is preferably $5 \times 10^7$ Pa or less. A desirable value of elastic modulus in shear may be obtained by heating the binding agent to a temperature of 100 to 300° C., although the temperature must be controlled so as not to decompose or vaporize the material. When physical vapor deposition is carried out at the normal temperature, the binding agent is preferably an elastic material having hardness of about 80° (JIS-A).

It is preferable that the binding agent have high elastic modulus in shear after being subjected to physical vapor deposition of the magnetic material, in order to maintain the heterogeneous structure described previously. By processing the binding agent to have a high elastic modulus in shear after physical vapor deposition of the magnetic material, it is made possible to surely prevent the atoms of the magnetic material or clusters thereof from aggregating and crystallizing into fine particles on the nanometer scale. Specifically, the elastic modulus in shear is preferably in a range from $1 \times 10^7$ Pa or higher in a temperature range in which the electromagnetic noise suppressor is used. It is preferable to crosslink the binding agent after physical vapor deposition of the magnetic material, in order to obtain the desired value of elastic modulus in shear.

In this regard, the binding agent is preferably a thermosetting resin or a resin that is cured when exposed to an energy beam (ultraviolet light, electron beam) which allows the elastic modulus to be low during vapor deposition and to be increased by crosslinking after the vapor deposition.

The binding agent may also include silane coupling agent, titanate coupling agent, nonionic surfactant, polar resin oligomer or the like, so that part of the magnetic material that has been turned into plasma or been ionized can react with the binding agent and be stabilized. Adding such an additive enables it to not only prevent oxidization but also prevent a homogeneous film from being formed by the aggregation of atoms so as to prevent the reflection of electromagnetic radiation by the homogeneous film, thereby improving the absorbing property.

In addition to the above, the binding agent may also contain reinforcement fillers, flame retarding agents, anti-aging agents, anti-oxidizing agents, colorants, thixotropy enhancing agents, plasticizers, lubricants and heat resistance enhancing agents. Care should be exercised, however, since adding a hard material leads to collision with the atoms of the magnetic material, thus resulting in insufficient dispersion. Weatherability may also be improved by coating with silicon oxide or silicon nitride by vapor deposition, after the vapor deposition of the magnetic material.

The electromagnetic noise suppressor of the present invention may have either a planar configuration such as sheet or a three-dimensional structure. The shape may also be adapted to the shape of a structure to be made as the product, when it is used to cover the surface of the structure as will be described later.

<Method of Manufacturing the Electromagnetic Noise Suppressor>

The method of manufacturing the electromagnetic noise suppressor will now be described.

The electromagnetic noise suppressor of the present invention can be made by forming the composite layer on the surface of the binding agent by physical vapor deposition of the magnetic material onto the binding agent.

In the physical vapor deposition (PVD), a material is vaporized in a vacuum vessel and is deposited on a substrate that is placed in the vicinity of the material being vaporized, so as to form a thin film. The process is classified by the method of evaporation into vaporization process and sputtering process. Vaporization processes include EB vapor deposition and ion plating, and sputtering processes include high frequency sputtering, magnetron sputtering and opposing target type magnetron sputtering process.

In the EB vapor deposition, since the vapor particle has small energy of 1 eV, less damage is caused on the substrate and the film tends to become porous and have insufficient strength, while the specific resistivity of the film increases.

In the ion plating process, since ions of argon gas and vaporized particles are accelerated and collide with the substrate, particle energy is about 1 KeV, higher than in the case of EB. Therefore a film having high adhesive force can be obtained, although it cannot be avoided that particles having sizes on the micrometer scale, called droplets, deposit on the surface and cause interruptions of discharge. An oxide film may be formed by introducing a reactive gas such as oxygen.

In the magnetron sputtering process, although the target (material to be vaporized) is utilized with less efficiency, growth rate is higher since strong plasma is generated by the effect of magnetic field and a high energy of several tens of electron volts (eV) is given to the particle. In the high frequency sputtering process, an insulating target may be used.

Among the magnetron sputtering processes, the opposing target type magnetron sputtering process is a process where plasma is generated between opposing targets and is confined by the magnetic field, while the substrate is placed outside of the opposing targets so as to form a desired thin film without causing damage from the plasma. Therefore, a film of the same composition as that of the target that is made of a dense material can be formed without need to sputter the thin film of the substrate again and mitigating the collision of the sputtered atoms with further higher growth rate.

In the case in which the binding agent is a resin (or rubber), covalent bonding energy of the resin is about 4 eV. Bonding energies of C—C, C—H, Si—O and Si—C, for example, are 3.6 eV, 4.3 eV, 4.6 eV and 3.3 eV, respectively. In the ion plating, magnetron sputtering, or opposing target type magnetron sputtering process, in contrast, the vaporized particles have high energies and therefore may collide with the binding agent and break part of the chemical bonding of the resin.

Therefore, it is supposed that, when the binding agent made of resin (or rubber) has a sufficiently low elastic modulus in the present invention, molecules of the resin vibrate and are sometimes broken when the magnetic material is deposited, resulting in localized mixing of the atoms of the magnetic material and the resin and, with the atoms of the magnetic material infiltrating into the resin to a depth of up to 3 μm from the surface, cause interaction with the resin, so that the composite layer having heterogeneous structure of nanometer scale is formed.

It is preferable to deposit the magnetic material with a particle energy of 5 eV or higher to the binding agent by physical vapor deposition, since it enables it to disperse a large amount of the magnetic material in the binding agent at the same time. Since a large amount of the magnetic material can be processed in a single deposition run, the electromagnetic noise suppressor having high electromagnetic noise suppressing effect can be easily made. Since velocity of the binding agent in vibration thereof is lower than the velocity of the particle, rate of vapor deposition is preferably set to be low in accordance with the timing of relaxation of the binding agent, about 60 nm/min or less depending on the kind of magnetic material.

As the magnetic material to be vaporized in the vapor deposition process, a metal-based soft magnetic material, an oxide-based soft magnetic material and/or a nitride-based soft magnetic material is mainly used. Any one of these materials or a mixture of two or more of these materials may be used.

As the metal-based soft magnetic material, iron or an iron alloy is commonly employed. As the iron alloy, Fe—Ni, Fe—Co, Fe—Cr, Fe—Si, Fe—Al, Fe—Cr—Si, Fe—Cr—Al, Fe—Al—Si or Fe—Pt alloy may be used. Any one of these materials or a mixture of two or more of these materials may be used. Either one of these metal-based soft magnetic materials or a mixture of two or more of these materials may be used. Besides iron and iron alloy, cobalt, nickel or an alloy thereof may also be used. Nickel has resistance against oxidation and is therefore preferably used independently.

As the oxide-based soft magnetic material, ferrite is preferably used. Specifically, $MnFe_2O_4$, $CoFe_2O_4$, $NiFe_2O_4$, $CuFe_2O_4$, $ZnFe_2O_4$, $MgFe_2O_4$, $Fe_3O_4$, Cu—Zn-ferrite, Ni—Zn-ferrite, Mn—Zn-ferrite, $Ba_2CO_2Fe_{12}O_{22}$, $Ba_2Ni_2Fe_{12}O_{22}$, $Ba_2Zn_2Fe_{12}O_{22}$, $Ba_2Mn_2Fe_{12}O_{22}$, $Ba_2Mg_2Fe_{12}O_{22}$, $Ba_2Cu_2Fe_{12}O_{22}$ or $Ba_3CO_2Fe_{24}O_{41}$, may be used. These variations of ferrite may be used either independently or in a combination of two more kinds thereof.

As nitride-based soft magnetic material, $Fe_2N$, $Fe_3N$, $Fe_4N$, $Fe_{16}N_2$, etc., are known. These nitride-based soft magnetic materials have high magnetic permeability and high corrosion resistance, and are therefore preferably used.

During the physical vapor deposition of the magnetic material onto the binding agent, since atoms of the magnetic material infiltrate into the binding agent in the form of plasma or ions, the composition of the magnetic material dispersed in the binding agent is not necessarily the same as that of the magnetic material before being vaporized. The magnetic material may have reacted with part of the binding agent and changed into paramagnetic material or antiferromagnetic material.

The amount of the magnetic material deposited on the binding agent in a single deposition run is preferably 200 nm or less in terms of thickness of the magnetic material layer. When deposited to a larger thickness, limitation of the capacity of the binding agent to include the magnetic material is reached such that the magnetic material cannot be dispersed in the binding agent any more and is instead deposited on the surface, thereby forming a continuous bulk film that has uniform conductivity. Therefore, the amount of the magnetic material to be deposited is preferably 100 nm or less, and more preferably 50 nm or less. In view of the electromagnetic noise suppressing effect, the amount of the magnetic material to be deposited is preferably 0.5 nm or less.

Since less amount of deposition leads to lower electromagnetic noise suppressing effect, the total amount of the magnetic material can be increased by stacking a plurality of composite layers. The total amount of deposition is preferably in a range from 10 to 500 nm in terms of total thickness of the magnetic material, while it depends on the required level of electromagnetic noise suppression. Part of the layers to be stacked may also be formed as bulk metal layers that have continuity, so as to have reflectivity to electromagnetic radiation. The layers may also be formed in composite structure with the dielectric material layer so as to control the electromagnetic noise suppressing effect.

While there is no restriction on the thickness of the binding agent used in the vapor deposition process, it is preferably as small as possible in order to make a compact electromagnetic noise suppressor. Specifically, the thickness is preferably 50 μm or less and more preferably 10 μm or less.

<Structure with Electromagnetic Noise Suppressing Function>

The structure with an electromagnetic noise suppressing function of the present invention is a structure with at least a part of the surface thereof covered by the electromagnetic noise suppressor of the present invention.

The structure may be, for example, a printed wiring board having electronic components mounted thereon, a semiconductor integrated circuit or the like.

Now specific examples of the structure with an electromagnetic noise suppressing function of the present invention will be described below.

(Camera Module)

Figure 3:
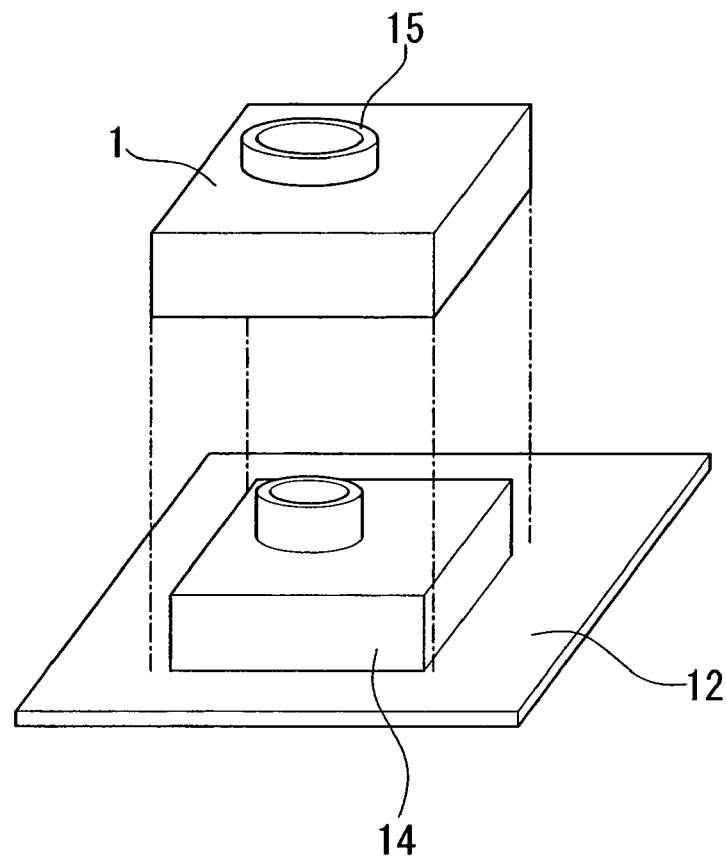
FIG. 3 is a perspective view of a camera module that is an example of structure with an electromagnetic noise suppressing function of the present invention.
Figure 4:
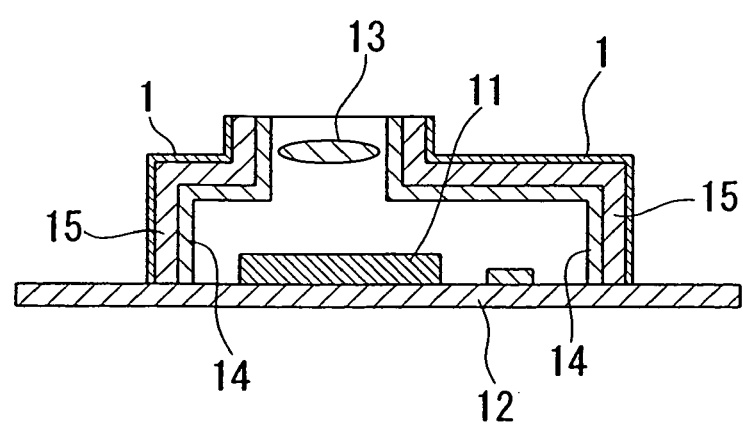
FIG. 4 is a sectional view of a camera module that is an example of structure with an electromagnetic noise suppressing function of the present invention.

FIG. 3 and FIG. 4 show a camera module as an example of the structure with an electromagnetic noise suppressing function. The camera module includes a printed wiring board 12 that has an image sensor 11 mounted on the surface thereof, a lens 13 that corresponds to the image sensor 11, a camera holder 14 that holds the lens 13 and encloses the image sensor 11 on the printed wiring board 12, an outer case 15 that fits on the outside of the camera holder 14, and the electromagnetic noise suppressor 1 that covers the surface of the outer case 15.

Covering of the outer case 15 with the electromagnetic noise suppressor 1 is carried out, for example, as follows. The outer case 15 that is a structure formed from a resin by injection molding is dipped in epoxy resin solution that is a binding agent so as to cover the surface with epoxy resin of B stage having a thickness of 15 μm. Then a composite layer is formed on the epoxy resin by physical vapor deposition to equivalent thickness of 45 nm. The outer case 15 that is provided with the electromagnetic noise suppressing function is fitted onto the camera holder 14, thereby shielding the camera module from noise.

(Printed Wiring Board)

Figure 5:
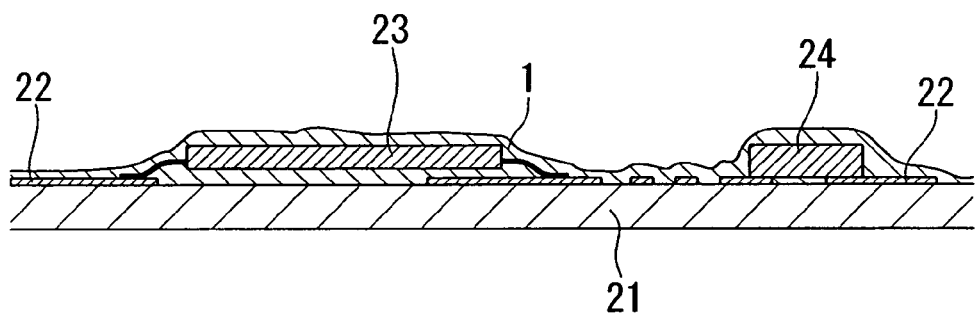
FIG. 5 is a sectional view of a printed wiring board having electronic components mounted thereon that is an example of the structure with an electromagnetic noise suppressing function of the present invention.

FIG. 5 shows a printed wiring board as another example of the structure with an electromagnetic noise suppressing function. The printed wiring board includes a circuit 22 formed on a substrate 21, a semiconductor package 23 and a chip component 24 that are connected to the circuit 22, and the electromagnetic noise suppressor 1 that covers the surface of the printed wiring board together with the circuit 22, the semiconductor package 23 and the chip component 24.

Covering of the printed wiring board with the electromagnetic noise suppressor 1 is carried out, for example, as follows.

An insulating binding agent is applied to the printed wiring board to a thickness of about 50 μm so as to cover the circuit 22, the semiconductor package 23 and the chip component 24. The magnetic material is deposited onto the binding agent by physical vapor deposition so as to form the composite layer. This process is not a wet process and does not require washing operation to remove ions, and is capable of easily rendering the electromagnetic noise suppressing function.

(Semiconductor Integrated Circuit)

To give electromagnetic noise suppressing function to a semiconductor integrated circuit, the magnetic material is deposited to a thickness of about 10 to 50 nm by physical vapor deposition to form a composite layer on an organic insulating film having a thickness from 200 nm to 100 μm that is formed from polyimide, polyparaxylene, polytetrafluoroethylene, polyaryl ether, polyxylylene, polyadamantane ether, polybenzo oxazole or benzocyclobutene resin that has been formed on a semiconductor wafer by spin coating process or CVD (chemical vapor deposition). The composite layer may also be formed partially by using a mask as required. Since this is a dry process, there is no influence of ionic impurity and there is no need for cleaning, and the process is preferable for the application to semiconductor wafers. When the electromagnetic noise suppressor having heterogeneous structure of nanometer scale is provided in the vicinity of microscopic semiconductor circuit, it is made possible to suppress the resonance of a digital circuit during pulse transmission and suppress radiation noise from being generated by impedance mismatch, thereby to improving the transmission characteristics such as transmission speed, even with a small amount of magnetic material.

The electromagnetic noise suppressor of the present invention described above has a high resonance frequency of 8 GHz or higher, supposedly because the composite layer is formed where the magnetic material and the binding agent are integrated by physical vapor deposition so that even a small amount of the magnetic material can achieve the quantum effect originating from the heterogeneous structure of nanometer scale, magnetic anisotropy of the material, morphological magnetic anisotropy or anisotropy due to external magnetic field, although theoretical explanation has not been presented. It is considered that such a feature enables achievement of satisfactory magnetic characteristics and electromagnetic noise suppressing effects over the entire sub-microwave band with even a small amount of the magnetic material.

Since the electromagnetic noise suppressor of the present invention can achieve the electromagnetic noise suppressing effect even with a small amount of the magnetic material, the amount of the magnetic material can be reduced significantly, resulting in weight reduction.

Also, since the electromagnetic noise suppressor of the present invention can achieve sufficient electromagnetic noise suppressing effect even with the composite layer having a thickness as small as 0.3 μm or less, the electromagnetic noise suppressor can be formed with a small thickness, so as to decrease the space requirement.

In the case in which the composite layer is formed by physical vapor deposition of the magnetic material onto the binding agent, the magnetic material is dispersed in the state of atoms into the binding agent so that the magnetic material and the binding agent are integrated to form the composite layer having high electromagnetic noise suppressing effect with a small amount of the magnetic material. The composite layer does not include impurity ions so that there is no possibility of damage to the electronic circuit by the impurity ions.

Since the amount of the magnetic material can be reduced significantly, decrease in flexibility and in strength of the resin or rubber due to the magnetic material can be minimized in the case in which the binding agent is resin or rubber.

Moreover, if the binding agent is a curable resin, the magnetic material is distributed uniformly in the binding agent prior to curing and, after being cured, the magnetic material can be suppressed from crystallizing into fine particles even when the electromagnetic noise suppressor is used at a high temperature, thus improving the weatherability.

The structure with an electromagnetic noise suppressing function of the present invention (for example, printed wiring board or semiconductor integrated circuit) enables it to dispose the noise suppressor with small space requirement in the vicinity of the noise source and efficiently suppress electromagnetic noise in the sub-microwave band.

EXAMPLES

Examples of the present invention will now be described.

(Evaluation)

The measurement of magnetic permeability: Ultra-high frequency magnetic permeability measuring instrument PMM-9G1 manufactured by Ryowa Electronics Co., Ltd., was used. Observation of cross section: Cross section was observed with a transmission electron microscope H9000NAR manufactured by Hitachi, Ltd.

Electromagnetic radiation absorbing characteristic: Transmission noise suppressing effect was evaluated by S parameter method using test fixture TF-3A, TF-18A for micro strip line having impedance of 50 Ω manufactured by KEYCOM Corporation.

Coupling coefficient in near field was evaluated using micro loop antenna type fixture manufactured by KEYCOM Corporation. Vector network analyzer 37247C manufactured by Anritsu Company was used.

Example 1

A silicone rubber that had been vulcanized having a thickness of 15 μm (elastic modulus in shear of $1\times10^7$ Pa at normal temperature containing wet silica) was provided as the binding agent on a polyethylene phthalate film used as the support layer having a thickness of 12 μm (elastic modulus in shear of $3.8\times10^9$ Pa at the normal temperature), and thereon a composite layer was formed by sputtering Fe—Ni-based soft magnetic metal to an equivalent thickness of 20 nm by physical vapor deposition of the opposing target type magnetron sputtering process, thereby to obtain the electromagnetic noise suppressor. Sputtering was carried out by applying a low negative voltage so as to impart energy of 8 eV to the vaporized particles while maintaining the substrate at the normal temperature.

Figure 6:
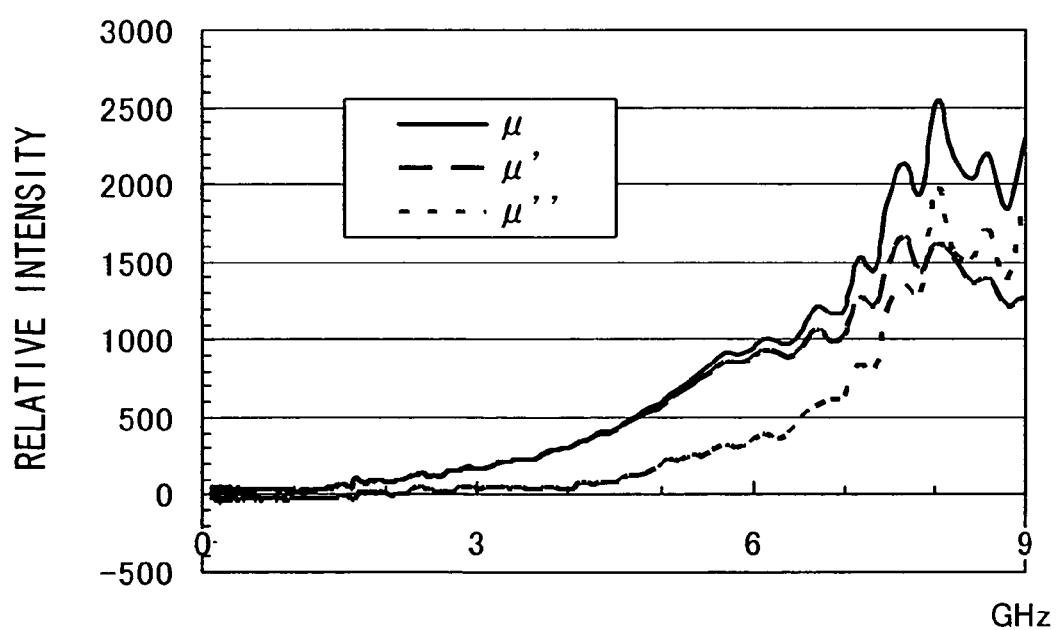
FIG. 6 is a graph showing the complex magnetic permeability versus frequency in electromagnetic noise suppressor of Example 1.

Then a thin portion was sliced by means of a microtome from the electromagnetic noise suppressor thus obtained and, after polishing the cut surface by ion beam, cross section of the composite layer was observed with a high-resolution transmission electron microscope. The thickness of the composite layer was about 45 nm. The cross section thus observed is shown in FIG. 1. Magnetic permeability was measured with a magnetic permeability measuring instrument. As shown in FIG. 6, relative intensity of $\mu"_L$ was 250 and relative intensity of $\mu"_H$ was about seven times the value described above. The magnetic resonance frequency (the frequency at which the value of μ' becomes one-half of the peak value, and which is higher than the peak frequency) exceeded 9 GHz, the measurement limit of the instrument. The measurement of the electromagnetic radiation absorbing characteristics showed that reflection attenuation was −9.5 dB and transmission attenuation was −5.5 dB at 1 GHz, while reflection attenuation was −14 dB and transmission attenuation was −20 dB at 10 GHz.

Example 2

Figure 7:
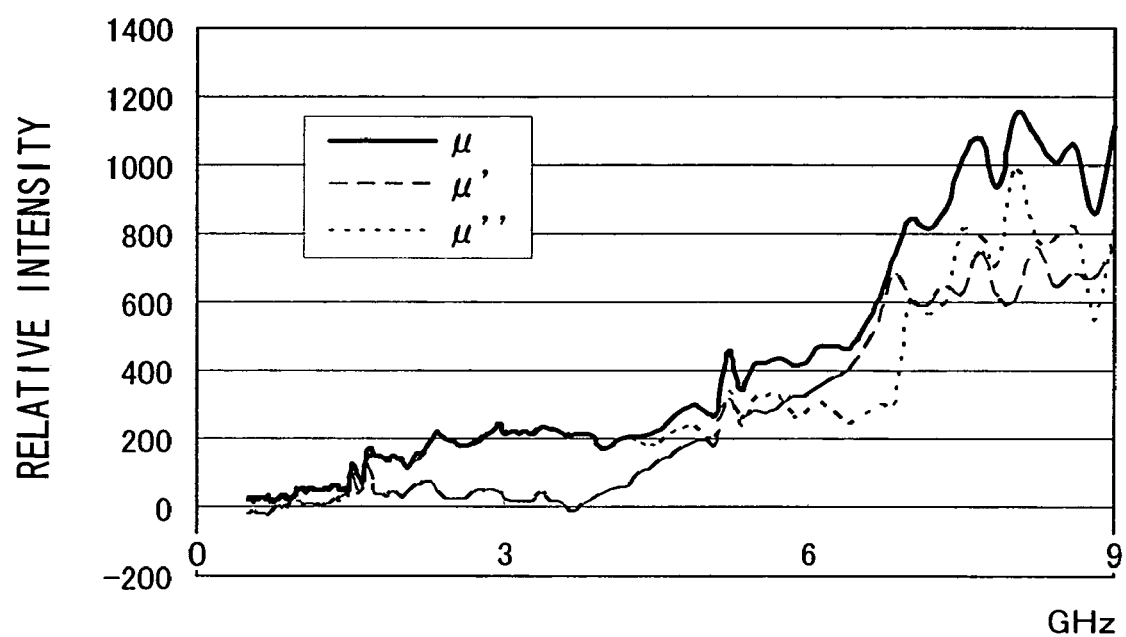
FIG. 7 is a graph showing the complex magnetic permeability versus frequency in electromagnetic noise suppressor of Example 2.

An epoxy resin of B stage having a thickness of 25 μm (elastic modulus in shear of $8\times10^6$ Pa before curing and elastic modulus in shear of $2\times10^9$ after curing) was provided as the binding agent on a polyethylene terephthalate film that had been subjected to mold-release treatment and used as the support layer having a thickness of 12 μm, and thereon a composite layer was formed by depositing Fe—Ni-based soft magnetic metal to an equivalent thickness of 10 nm by physical vapor deposition of the opposing target type magnetron sputtering process. Sputtering was carried out by applying a low negative voltage so as to impart energy of 8 eV to the vaporized particles while maintaining the substrate at the normal temperature. The epoxy sheet was removed from the polyethylene phthalate film and was cut into halves, and the epoxy sheet were placed on the other so that the composite layers were stacked alternately. The stack was heated to 40° C. for 6 hours then 120° C. for 2 hours so as to harden the epoxy resin, thereby to obtain the electromagnetic noise suppressor. As shown in FIG. 7, relative intensity of $\mu"_L$ was 200 and relative intensity of $\mu"_H$ was about five times the value described above. The magnetic resonance frequency (the frequency at which the value of μ' becomes one-half of the peak value, and which is higher than the peak frequency) exceeded 9 GHz, the measurement limit of the instrument. The measurement of the electromagnetic radiation absorbing characteristics showed that internal coupling coefficient was −8 dB and mutual coupling coefficient was −7 dB at 3 GHz.

Example 3

Metal Ni was deposited to a thickness of 30 nm on one side of a polyimide film used as the support layer having a thickness of 12 μm, and provided on the other side was vulcanized electrically conductive silicone rubber having a thickness of 7 μm (elastic modulus in shear of $2\times10^7$ Pa at the normal temperature with 15% by weight of carbon black included) as the binding agent. Then composite layers were formed on the top and bottom surfaces by depositing a Fe—Ni-based soft magnetic metal to equivalent thickness of 20 nm by physical vapor deposition of opposing target type magnetron sputtering process, thereby to obtain an electromagnetic noise suppressor. Sputtering was carried out by applying a low negative voltage so as to impart energy of 8 eV to the vaporized particles while maintaining the substrate at the normal temperature. Relative intensity of $\mu"_L$ of the imaginary part of the complex magnetic permeability was 180 and relative intensity of $\mu"_H$ was about six times the value described above. The magnetic resonance frequency (the frequency at which the value of μ' becomes one-half of the peak value, and which is higher than the peak frequency) exceeded 9 GHz, the measurement limit of the instrument. The measurement of the electromagnetic radiation absorbing characteristics showed that internal coupling coefficient was −3 dB and mutual coupling coefficient was −4 dB at 1 GHz.

Example 4

An epoxy resin of B stage containing NBR (elastic modulus in shear of $8\times10^6$ Pa before curing and elastic modulus in shear of $8\times10^8$ Pa after curing) was provided as the binding agent on a metallic conductor formed on a polyimide film with wiring pitch of 0.3 mm, and thereon a composite layer was formed by depositing Fe—Ni-based soft magnetic metal to an equivalent thickness of 15 nm by physical vapor deposition of the opposing target type magnetron sputtering process. Sputtering was carried out by applying a low negative voltage so as to impart energy of 8 eV to the vaporized particles while maintaining the substrate at the normal temperature. The sample was heated to 40° C. for 6 hours then 120° C. for 2 hours so as to harden the epoxy resin, thereby to obtain a printed wiring board having the electromagnetic noise suppressor provided thereon.

The wiring board, an LCD (controller LSI is provided on glass) and a CPU of a mobile telephone were connected with each other. Display of moving picture was compared with one that was not provided with the electromagnetic noise suppressor, and the Example showed a display that was not influenced by crosstalk without faulty signal compared to that without the electromagnetic noise suppressor.

INDUSTRIAL APPLICABILITY

The electromagnetic noise suppressor of the present invention can be used to cover electronics apparatus and electronic components, and enables the manufacture of electronic apparatuses and electronic components that are smaller and lighter in weight while achieving sufficient electromagnetic noise suppressing effect over entire the sub-microwave band.

The invention claimed is:

1. An electromagnetic noise suppressor having:
   a magnetic resonance frequency of 8 GHz or higher; and
   an imaginary part $\mu''_H$ of complex magnetic permeability at 8 GHz which is higher than an imaginary part $\mu''_L$ of complex magnetic permeability at 5 GHz,
   wherein the electromagnetic noise suppressor includes a composite layer including a heterogeneous structure where a binding agent and a magnetic material are integrated at the nanometer scale, wherein the composite layer includes a portion where a crystal lattice is observed to be made up of atoms of the magnetic material, a portion where only the binding agent is observed, and a portion where atoms of the magnetic material are observed to be dispersed in the binding agent without crystallizing, and the thickness of the composite layer is at least 0.005 μm and at most 0.3 μm; and
   the binding agent is at least one resin or rubber selected from the group consisting of polyolefine resin, polyamide resin, polyester resin, polyether resin, polyketone resin, phenol resin, epoxy resin, acrylic resin, polyacrylate resin, natural rubber, isoprene rubber, butadiene rubber, styrene butadiene rubber, butyl rubber, and ethylene propylene rubber.

2. The electromagnetic noise suppressor according to claim 1, wherein the binding agent is a hardening resin.

3. An electromagnetic noise suppressor according to claim 1, wherein the composite layer is formed by physically vapor-depositing the magnetic material onto the binding agent.

4. An electromagnetic noise suppressor according to claim 3, wherein the binding agent is a resin or a rubber.

5. The electromagnetic noise suppressor according to claim 3 wherein the binding agent is a hardening resin.

6. An electromagnetic noise suppressor having:
   a magnetic resonance frequency of 8 GHz or higher; and
   an imaginary part $\mu''_H$ of complex magnetic permeability at 8 GHz which is higher than an imaginary part $\mu''_L$ of complex magnetic permeability at 5 GHz,
   wherein the electromagnetic noise suppressor includes a composite layer including a heterogeneous structure where a binding agent and a magnetic material are integrated at the nanometer scale, wherein the composite layer includes a portion where a crystal lattice is observed to be made up of atoms of the magnetic material, a portion where the binding agent is observed without presence of the magnetic material, and a portion where atoms of the magnetic material are observed to be dispersed in the binding agent without crystallizing, and the thickness of the composite layer is at least 0.005 μm and at most 0.3 μm.

7. An electromagnetic noise suppressor having:
   a magnetic resonance frequency of 8 GHz or higher; and
   an imaginary part $\mu''_H$ of complex magnetic permeability at 8 GHz which is higher than an imaginary part $\mu''_L$ of complex magnetic permeability at 5 GHz,
   wherein the electromagnetic noise suppressor includes a composite layer including a heterogeneous structure where a binding agent and a magnetic material are integrated at the nanometer scale, wherein the composite layer includes a portion where a crystal lattice is observed to be made up of atoms of the magnetic material, a portion where only the binding agent is observed, and a portion where atoms of the magnetic material are observed to be dispersed in the binding agent without crystallizing, atoms of the magnetic material being separated by less than 10 nm, and the thickness of the composite layer is at least 0.005 μm and at most 0.3 μm.

* * * * *

UNITED STATES PATENT AND TRADEMARK OFFICE
CERTIFICATE OF CORRECTION

PATENT NO. : 7,625,640 B2 Page 1 of 1
APPLICATION NO. : 10/538132
DATED : December 1, 2009
INVENTOR(S) : Toshiyuki Kawaguchi, Atsushi Taniguchi and Takashi Gonda It is certified that error appears in the above-identified patent and that said Letters Patent is hereby corrected as shown below:

Please correct the second and third inventor's city of residence to:

Title Page Item (75) Inventors:   Toshiyuki Kawaguchi, Tokyo (JP);
Atsushi Taniguchi, Saitama-shi (JP);
Takashi Gonda, Saitama-shi (JP)

Signed and Sealed this

Eleventh Day of May, 2010

David J. Kappos
*Director of the United States Patent and Trademark Office*